United States Patent
Lin et al.

(10) Patent No.: US 8,205,147 B2
(45) Date of Patent: Jun. 19, 2012

(54) STRUCTURED DE-INTERLEAVING SCHEME FOR PRODUCT CODE DECODERS

(75) Inventors: Xiaotong Lin, Bethlehem, PA (US); Fan Zhou, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 982 days.

(21) Appl. No.: 12/189,392

(22) Filed: Aug. 11, 2008

(65) Prior Publication Data

US 2008/0301522 A1 Dec. 4, 2008

Related U.S. Application Data

(62) Division of application No. 11/167,478, filed on Jun. 27, 2005, now Pat. No. 7,434,138.

(51) Int. Cl.
 *G06F 11/00* (2006.01)
(52) U.S. Cl. .................................. 714/804; 714/762
(58) Field of Classification Search .................. None
 See application file for complete search history.

(56) References Cited

U.S. PATENT DOCUMENTS

| | | | | |
|---|---|---|---|---|
| 4,044,328 A * | 8/1977 | Herff | ............... | 714/804 |
| 4,547,882 A | 10/1985 | Tanner | ............... | 714/755 |
| 5,299,208 A | 3/1994 | Blaum et al. | ............... | 714/761 |
| 5,465,260 A | 11/1995 | Zook | ............... | 714/758 |
| 5,650,969 A * | 7/1997 | Niijima et al. | ............... | 365/200 |
| 5,751,730 A | 5/1998 | Mourot | ............... | 714/755 |
| 5,991,857 A | 11/1999 | Koetje et al. | ............... | 711/157 |
| 6,681,362 B1 | 1/2004 | Abbott et al. | ............... | 714/755 |
| 7,093,179 B2 | 8/2006 | Shea | ............... | 714/755 |
| 7,178,082 B2 * | 2/2007 | Yu et al. | ............... | 714/752 |
| 7,254,769 B2 * | 8/2007 | Kim et al. | ............... | 714/774 |
| 7,555,696 B2 * | 6/2009 | Schmidt | ............... | 714/758 |
| 7,764,657 B2 * | 7/2010 | Sebire | ............... | 370/335 |
| 7,890,834 B2 * | 2/2011 | Blankenship et al. | ......... | 714/755 |
| 8,041,891 B2 * | 10/2011 | Wang et al. | ............... | 711/114 |
| 2007/0011502 A1 * | 1/2007 | Lin et al. | ............... | 714/702 |
| 2010/0100788 A1 * | 4/2010 | Yang et al. | ............... | 714/752 |
| 2010/0241925 A1 * | 9/2010 | Wang et al. | ............... | 714/758 |
| 2010/0257426 A1 * | 10/2010 | Yokokawa et al. | ............ | 714/752 |

OTHER PUBLICATIONS

Non-Final Office Action; Mailed Oct. 10, 2007 for corresponding U.S. Appl. No. 11/167,478 filed Jun. 27, 2005; 18 pages.
Final Office Action; Mailed Jan. 30, 2008 for corresponding U.S. Appl. No. 11/167,478 filed Jun. 27, 2005; 7 pages.
Advisory Action; Mailed Apr. 30, 2008 for corresponding U.S. Appl. No. 11/167,478 filed Jun. 27, 2005; 3 pages.
Notice of Allowance and Fees Due; Mailed Jun. 4, 2008 for corresponding U.S. Appl. No. 11/167,478 filed Jun. 27, 2005; 6 pages.

* cited by examiner

*Primary Examiner* — Christopher McCarthy
(74) *Attorney, Agent, or Firm* — Mendelsohn, Drucker & Associates, P.C.; Steve Mendelsohn (57) ABSTRACT

A structured interleaving/de-interleaving scheme enables efficient implementation of encoding/decoding based on two-dimensional product codes (2D PC). An encoder has an integrated architecture that performs structured interleaving and PC coding in an integrated manner in which locations in the interleaved data stream are related to row and column indices for the 2D PC coding based on closed-form expressions. In one embodiment, a corresponding decoder implements two-stage low-density parity-check (LDPC) decoding based on the same relationships between locations in the interleaved data stream and row and column indices for the LDPC decoding.

14 Claims, 6 Drawing Sheets

TABLE 1: RELATIONSHIP BETWEEN INTERLEAVED BIT LOCATIONS AND UN-INTERLEAVED MATRIX LOCATIONS

| INTERLEAVED BIT LOCATION S | ROW INDEX n | COLUMN INDEX m | BIT |
|---|---|---|---|
| 0 | 0 | 0 | N |
| 1 | 1 | 1 | b1 |
| 2 | 2 | 2 | b2 |
| 3 | 3 | 3 | b3 |
| 4 | 0 | 1 | p1 |
| 5 | 1 | 2 | b4 |
| 6 | 2 | 3 | b5 |
| 7 | 3 | 0 | p6 |
| 8 | 0 | 2 | p2 |
| 9 | 1 | 3 | b6 |
| 10 | 2 | 0 | p5 |
| 11 | 3 | 1 | b7 |
| 12 | 0 | 3 | p3 |
| 13 | 1 | 0 | p4 |
| 14 | 2 | 1 | b8 |
| 15 | 3 | 2 | b9 |

FIG. 1A

COLUMN

|   | 0 | 1 | 2 | 3 |
|---|---|---|---|---|
| 0 | 0 | 4 | 8 | 12 |
| 1 | 13 | 1 | 5 | 9 |
| 2 | 10 | 14 | 2 | 6 |
| 3 | 7 | 11 | 15 | 3 |

ROW

FIG. 1B

COLUMN

|   | 0 | 1 | 2 | 3 |
|---|---|---|---|---|
| 0 | N | p1 | p2 | p3 |
| 1 | p4 | b1 | b4 | b6 |
| 2 | p5 | b8 | b2 | b5 |
| 3 | p6 | b7 | b9 | b3 |

ROW

FIG. 2

| TABLE 1: RELATIONSHIP BETWEEN INTERLEAVED BIT LOCATIONS AND UN-INTERLEAVED MATRIX LOCATIONS | | | |
|---|---|---|---|
| INTERLEAVED BIT LOCATION S | ROW INDEX n | COLUMN INDEX m | BIT |
| 0 | 0 | 0 | N |
| 1 | 1 | 1 | b1 |
| 2 | 2 | 2 | b2 |
| 3 | 3 | 3 | b3 |
| 4 | 0 | 1 | p1 |
| 5 | 1 | 2 | b4 |
| 6 | 2 | 3 | b5 |
| 7 | 3 | 0 | p6 |
| 8 | 0 | 2 | p2 |
| 9 | 1 | 3 | b6 |
| 10 | 2 | 0 | p5 |
| 11 | 3 | 1 | b7 |
| 12 | 0 | 3 | p3 |
| 13 | 1 | 0 | p4 |
| 14 | 2 | 1 | b8 |
| 15 | 3 | 2 | b9 |

STRUCTURED DE-INTERLEAVING SCHEME FOR PRODUCT CODE DECODERS

This application is a divisional of co-pending U.S. patent application Ser. No. 11/167,478, filed on Jun. 27, 2005, the teachings of which are incorporated herein by reference in their entirety.

BACKGROUND OF THE INVENTION

1. Field of the Invention

The present invention relates to decoding of data in communication systems, and, more particularly, to decoders that implement both a product-code data decoding scheme and a data de-interleaving scheme.

2. Description of the Related Art

Many digital transmission systems commonly employ techniques for detection of digital data represented by a sequence of symbols. The symbol bits are transferred as a signal through a transmission (i.e., communication) channel in which noise is typically added to the transmitted signal. For example, magnetic recording systems first encode data into symbol bits that are recorded on a magnetic medium. Writing data to, storing data in, and reading data from the magnetic medium may be considered to take place via a transmission channel that has an associated frequency response. Similarly, each of wired, optical, wireless, and cellular communication systems also transfers encoded data through a channel, which encoded data is then detected and decoded by a receiver. The signal may be read from the channel as a sampled signal (i.e., a sequence of sample values) representing the transmitted encoded data. For processing convenience, the encoding and decoding process is applied to blocks of data, each block representing a portion of the original data sequence.

In order to accurately transmit and recover an original data sequence, some communication systems rely on both a data encoding scheme and a data interleaving scheme. In general, a data encoding scheme combines error detection/correction data with the original data sequence to generate an encoded data stream, where the error detection/correction data is derived from the original data sequence and enables a receiver of the encoded data stream to detect and possibly correct one or more data errors (e.g., bit errors) that occur during the transmission and/or reception of the encoded data stream.

A data interleaving scheme rearranges the order of the data in a transmitted stream such that, after de-interleaving is performed at the receiver, sequences of consecutive data errors (e.g., resulting from bursty noise in the transmission channel or sample timing errors at the receiver) are distributed (i.e., spread out such that they are no longer consecutive) in the de-interleaved stream. Distributing the errors increases the chances that the receiver will be able to successfully detect and possibly correct all of the data errors using the error detection/correction data encoded into the transmitted stream.

One known type of data encoding scheme is based on product-code (PC) encoding. In two-dimensional PC encoding, N original data bits are arranged in an (n row×m column) rectangular matrix, where N=nm. Each of the n rows in the matrix represents an m-element data vector in one dimension of the 2D product code, and each of the m columns in the matrix represents an n-element data vector in the other dimension of the 2D product code. A check-code operation (e.g., based on Galois field 2 (GF(2)) addition, multiplication, or other linear operation) is then independently applied to each row data vector to generate a codeword row containing the row's original m data bits and one or more row-wise parity bits for that row. The same or another check-code operation is also independently applied to each original column data vector to generate a codeword column containing the column's original n data bits and one or more column-wise parity bits for that column.

In general, a receiver of the PC-encoded data can use the codeword rows and columns to perform some level of error detection and possibly even error correction for the received data. When single-bit parity check codes are employed on a per dimension basis, product codes typically exhibit optimum performance with respect to coding gain when correcting for single one-bit errors. In that case, only single, one-bit errors may be detected and corrected because of parity-check cancellation arising from an even number of errors occurring in a row or column and parity-check positional ambiguities associated with multiple one-bit errors.

The ability of a receiver to detect and possibly correct consecutive transmission/reception errors (i.e., burst errors) is increased when the data encoding scheme, such as a PC-encoding scheme, is implemented with a data interleaving scheme that distributes such errors in the de-interleaved stream. In general, an interleaving scheme may be represented by a mapping that maps each location of data in the un-interleaved (i.e., before interleaving) data stream to a corresponding location of data in the interleaved data stream. There are two basic types of interleaving schemes: structured interleaving and random interleaving.

In structured interleaving, the mapping can be represented by a closed-form mathematical expression whose input is one or more numbers that represent the un-interleaved location and whose output is one or more numbers that represent the corresponding interleaved location. As such, a structured interleaver for a transmitter can be designed to implement the closed-form mathematical expression to generate the interleaved location for each un-interleaved location. If the closed-form mathematical expression can be inverted, then a structured de-interleaver for a receiver can be designed to implement one or more inverted, closed-form mathematical expressions to generate the de-interleaved location for each interleaved location.

For purposes of this specification, a closed-form mathematical expression may be defined as an mathematical equation having one or more variables, where evaluation of the mathematical equation generates a numerical output value when the one or more variables are replaced by a corresponding set of one or more numerical input values. A closed-form mathematical expression may be said to be invertible, if there is a unique output value for each different set of input values and one or more closed-form mathematical expressions can be derived to map each of those different output values to its corresponding one or more input values.

In random interleaving, there is no closed-form mathematical expression for either the mapping from un-interleaved locations to interleaved locations or the mapping from inter-leaved locations to de-interleaved locations. In that case, random interleavers/de-interleavers are often implemented using look-up tables (LUTs) that explicitly relate each input location to its corresponding output location.

A conventional transmitter that implements both PC-encoding and interleaving is typically designed with a PC encoder that generates a block of PC-encoded data for each block of original data and a separate interleaver that maps each block of PC-encoded data into a stream of interleaved, PC-encoded data. Similarly, a corresponding receiver is typically designed with a de-interleaver that maps the stream of received, interleaved, PC-encoded data into blocks of de-interleaved, PC-encoded data and a separate PC decoder that generates a block of recovered data for each block of de-interleaved, PC-encoded data.

SUMMARY OF THE INVENTION

Embodiments of the present invention are based on a structured interleaving scheme that enables an encoder to be designed with an integrated architecture that combines product-code (PC) encoding with the structured interleaving to generate codewords for transmission over transmission channels. The structured interleaving scheme enables efficient decoding and de-interleaving of the resulting received codewords.

In one embodiment, the present invention is a method and apparatus for decoding a codeword generated by encoding and interleaving a set of $L^2$ original data values having an original sequence. The codeword is received having $L^2$ original data values, L row parity values, and L column parity values. Low-density parity-check decoding is applied to the codeword to generate a decoded codeword, wherein (1) the $L^2$ original data values correspond to an (L×L) original block of data, (2) each row parity value corresponds to an application of a row parity operation to a different row of the original block, (3) each column parity value corresponds to an application of a column parity operation to a different column of the original block, and (4) the codeword comprises the $L^2$ original data values in the original sequence and interleaved with the $L^2$ original data values.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Encoding/Interleaving Scheme

According to one embodiment of the present invention, an original data bitstream is divided into subsets of $L^2$ original data bits, where each subset is treated as an (L×L) block of original data bits. A two-dimensional product code (2D PC) is applied to each (L×L) block to generate a parity bit for each of the L columns and each of the L rows of the block, such that the corresponding set of encoded data has $L^2+2L$ bits. In addition to the 2D PC, a structured interleaving scheme is applied to interleave the encoded data.

In one possible implementation of the present invention, the structured interleaving scheme is defined by the following relationships.

Formula (1) identifies the interleaved locations for the original data and parity bits corresponding to each row n of the original (L×L) block, as follows:

$$n+m*(L+1), \text{ for } m=\{0,\ldots,L\}. \quad (1)$$

Formulas (2a) and (2b) identify the interleaved locations for the original data and parity bits corresponding to each column m of the original (L×L) block, as follows:

$$m+n*L \text{ for } n=\{0,\ldots,m\}, \quad (2a)$$

$$m+1+(n+1)*L \text{ for } n=\{m+1,\ldots,L\}. \quad (2b)$$

Formula (3) identifies the interleaved locations for the row parity bits, as follows:

$$(L+1)+L*m \text{ for } m=\{1,\ldots,L\} \quad (3)$$

Formula (4) identifies the interleaved locations for the column parity bits, as follows:

$$(L+1)*n \text{ for } n=\{1,\ldots,L\} \quad (4)$$

For example, for a (3×3) block of original data bits (i.e., L=3), Formula (1) identifies the following interleaved locations for each row n, as follows:

| Row | Interleaved Locations (for m = {0, ..., L}) |
|---|---|
| n = 1 | 1, 5, 9, 13 |
| n = 2 | 2, 6, 10, 14 |
| n = 3 | 3, 7, 11, 15 |

Formula (2) identifies the following interleaved locations for each column m, as follows:

| Column | Interleaved Locations (for n = {0, ..., L}) |
|---|---|
| m = 1 | 1, 4, 11, 14 |
| m = 2 | 2, 5, 8, 15 |
| m = 3 | 3, 6, 9, 12 |

Formula (3) identifies 7, 10, and 13 as the interleaved locations for the row parity bits, and Formula (4) identifies 4, 8, and 12 as the interleaved locations for the column parity bits.

The values generated using Formulas (1)-(4) can be used to populate an ((L+1)×(L+1)) block of encoded data. For example, we can see from Formulas (1) and (2) that Interleaved Location 1 falls in Row 1 and Column 1, while Interleaved Location 5 falls in Row 1 and Column 2. In addition, we can see from Formulas (1) and (3) that Interleaved Location 7 is the row parity bit for Row 3.

Figure 1A:
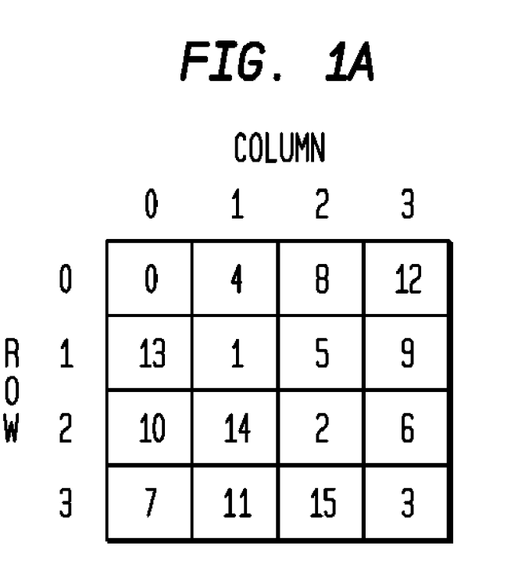
FIG. 1 illustrates an exemplary application of a structured interleaving scheme of the present invention in the context of a (3×3) square block of nine original data bits b1-b9.

FIG. 1a shows the interleaved locations from 0 to 15 for the 16 bits of a (4×4) block of encoded data generated using Formulas (1)-(4) for the case of L=3, where the 9 original data bits correspond to Columns 1-3 and Rows 1-3, the 3 row parity bits are in Column 0, the 3 column parity bits are in Row 0, and the (0,0) location is not used (i.e., Interleaved Location 0).

According to FIG. 1a, Interleaved Locations 1-3 correspond to original data bits, Interleaved Location 4 corresponds to a column parity bit, Interleaved Locations 5-6 correspond to original data bits, Interleaved Location 7 corresponds to a row parity bit, and so on.

Figure 1B:
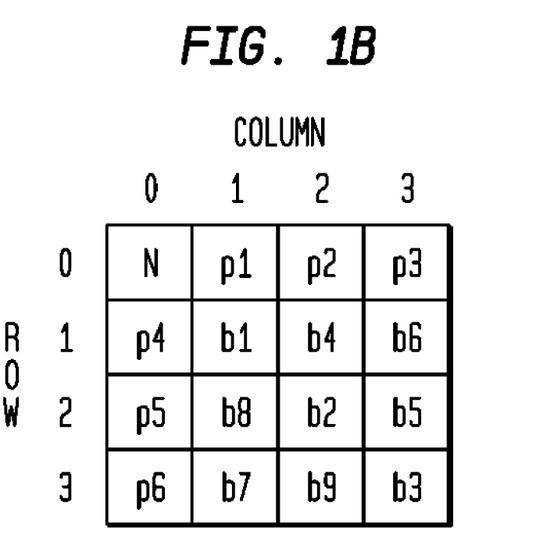
Figure 2:
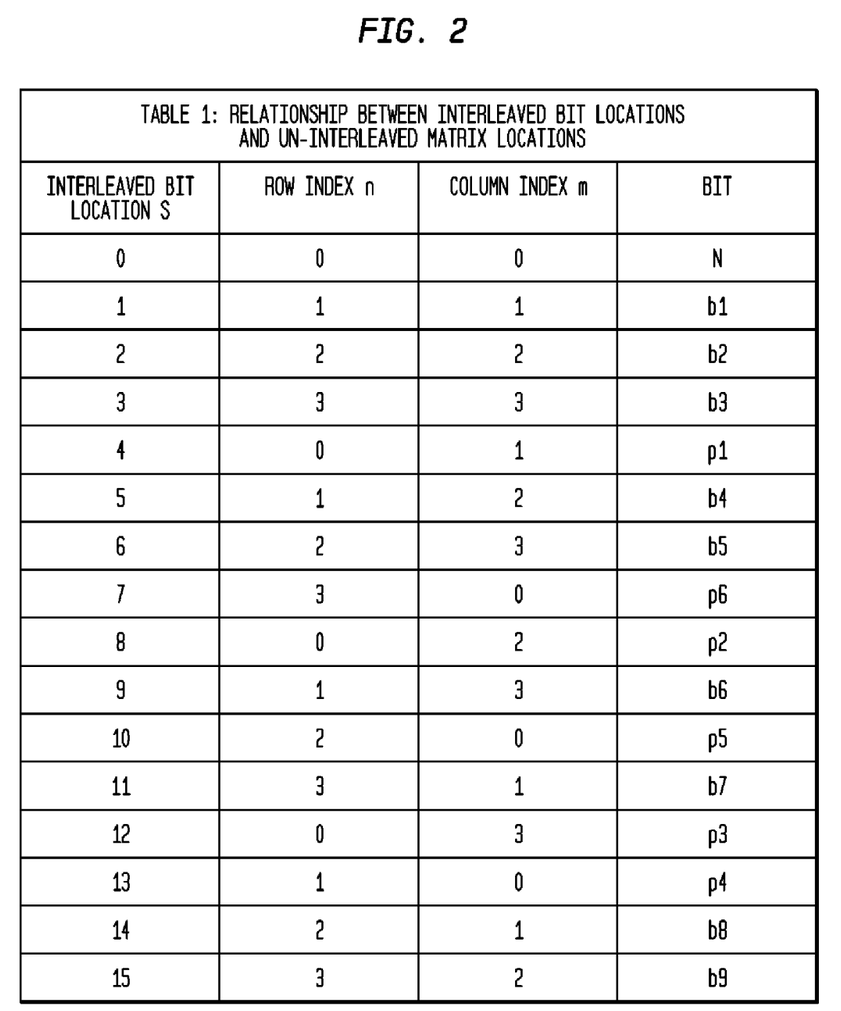
FIG. 2 shows Table I, which shows the relationship between interleaved bit locations and un-interleaved matrix locations for the exemplary application of FIG. 1.

FIG. 1b shows a (4×4) block of encoded data corresponding to the 9 original data bits (b1-b9) and corresponding 6 parity bits (p1-p6), where the (0,0) bit is not used. As shown in FIG. 1a, the 9 original data bits are stored in columns 1-3 and rows 1-3, while parity bits p1-p3 are the 3 column parity bits and parity bits p4-p6 are the 3 row parity bits. Note that the 9 original data bits are arranged in a diagonal pattern.

According to one possible implementation, a particular checksum operation is used to select the value of each parity bit such that application of the modulo-2 function to the sum of the bits in each codeword row and column results in 0, where the modulo-2 function (Y mod 2) returns the remainder resulting from application of integer division to the integer value Y by the integer value 2. Thus, (Y mod 2) equals 0 for all even integer values of Y and 1 for all odd integer values of Y. Using this checksum operation, the 6 parity bits (p1-p6) are generated to satisfy Equations (5)-(10), as follows:

$$(p1+b1+b8+b7) \bmod 2=0 \quad (5)$$

$$(p2+b4+b2+b9) \bmod 2=0 \quad (6)$$

$$(p3+b6+b5+b3) \bmod 2=0 \quad (7)$$

$$(p4+b1+b4+b6) \bmod 2=0 \quad (8)$$

$$(p5+b8+b2+b5) \bmod 2=0 \quad (9)$$

$$(p6+b7+b9+b3) \bmod 2=0 \quad (10)$$

The interleaved locations shown in FIG. 1a dictate the sequence used to transmit the encoded data to FIG. 1b. In particular, ignoring the (0,0) bit, the 15 bits of encoded data are transmitted in the following order (from left to right):

(b1, b2, b3, p1, b4, b5, p6, p2, b6, p5, b7, p3, p4, b8, b9).

Figure 3:
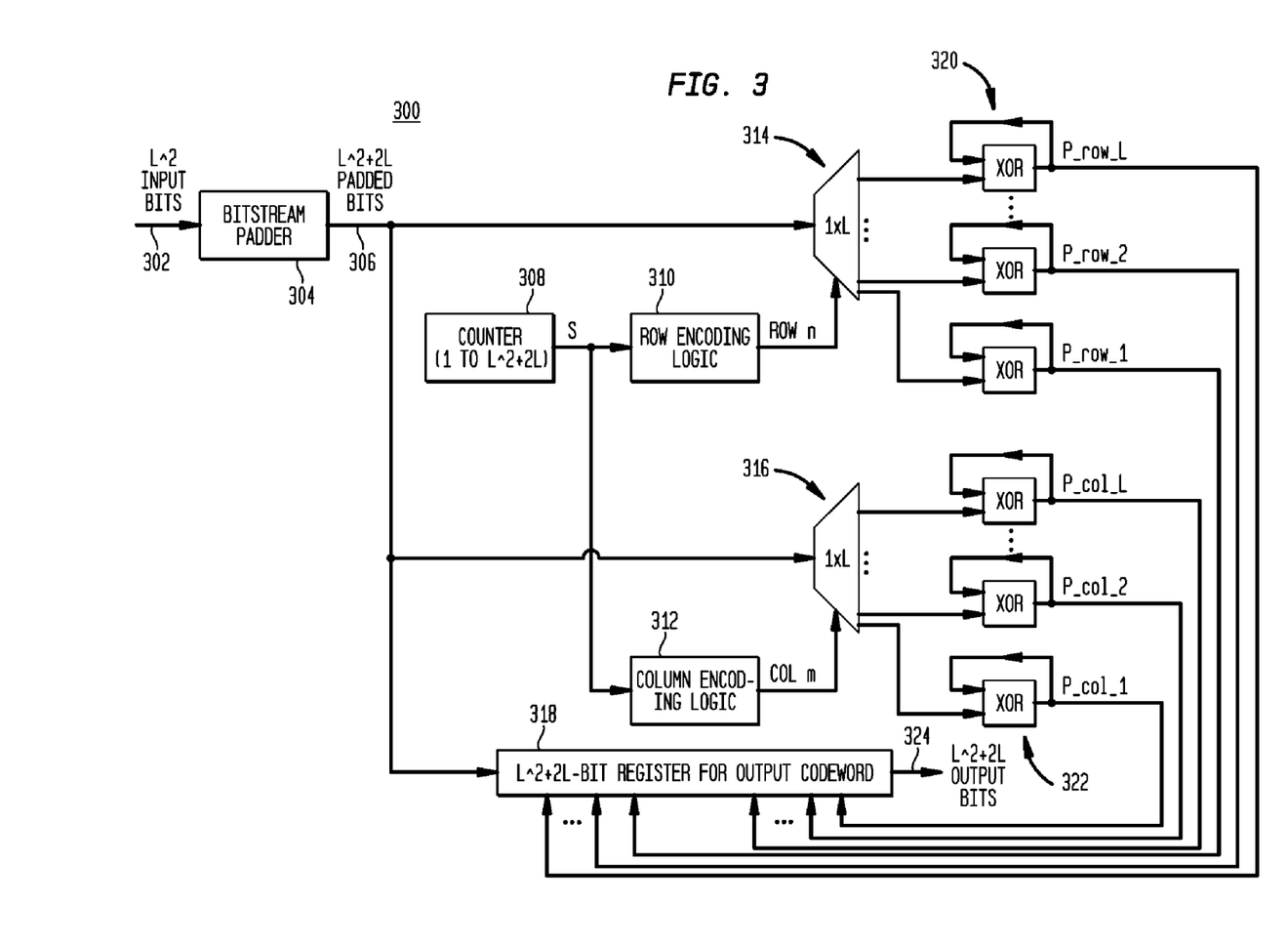
FIG. 3 shows a combined encoder/interleaver, according to one embodiment of the present invention.

Formulas (1)-(4) can be inverted to generate the closed-form mathematical expressions of Equations (11) and (12), which map the interleaved bit location S to the corresponding row index n and column index m of FIG. 1a, respectively, as follows:

$$n=\bmod(S,L+1) \quad (11)$$

$$m=\bmod(\bmod(S,L+1)+\mathrm{floor}(S,L+1)),L+1), \quad (12)$$

where the "floor" function returns the integer result of applying integer division between two values. Table I of FIG. 3 shows the row and column indices generated by applying Equations (11) and (12) to the sixteen interleaved bit locations S={0, . . . , 15} of FIG. 1a. Table I also shows the corresponding bit in FIG. 1b for each interleaved bit location S. Note that, since the (0,0) bit is not used, no data needs to be transmitted for Interleaved Location 0.

As indicated in both FIG. 1 and Table I, the 6 parity bits (p1-p6) fall in Row 0 and Column 0 and only parity bits fall in either Row 0 or Column 0. Thus, whenever Equations (11) and (12) generate a row or column index of zero, the corresponding bit is a parity bit. Furthermore, Formulas (13) and (14) provide closed-form mathematical expressions that identify the interleaved bit locations of the row and column parity bits, respectively, as follows:

$$S(\mathrm{row})=(L+1)*m, m=\{1, \ldots, L\} \quad (13)$$

$$S(\mathrm{column})=(L+1)+L*n, n=\{1, \ldots, L\} \quad (14)$$

For the current example of L=3, S(row)={4, 8, 12} and S(column)=(7, 10, 13), which is consistent with FIG. 1 and Table I.

Although Expressions (1)-(14) have been described for an exemplary (3×3) block of original data and its corresponding (4×4) PC-encoded matrix, these expressions can be applied to any (L×L) block of original data and its corresponding (L+1)×(L+1) PC-encoded matrix.

Combined Encoder/Interleaver

FIG. 3 shows a combined encoder/interleaver 300 according to one embodiment of the present invention. Encoder/interleaver 300 performs both PC encoding and structured interleaving to convert each set of $L^2$ original data bits 302 into an output codeword 324 having the $L^2$ original data bits interleaved with 2L parity bits.

In particular, for every sequence 302 of $L^2$ original data bits, bitstream padder 304 inserts 2L zero-valued padding bits at appropriate locations in the incoming bitstream, e.g., based on Formulas (13) and (14), to generate a sequence 306 of ($L^2$+2L) padded bits. The 2L padding bits will eventually be replaced by appropriate parity-bit values in the output codeword. For the L=3 example of FIG. 1a, the sequence of padded bits generated by padder 304 is (starting from the left):

(b1, b2, b3, 0, b4, b5, 0, 0, b6, 0, b7, 0, 0, b8, b9), where the (0,0) bit N of FIG. 1a is ignored. Note that the 9 original data bits appear in the padded sequence in their original sequence, with the padding bits interleaved at appropriate locations. Each bit in the padded sequence is sequentially applied to (1×L) row demultiplexer (demux) 314, (1×L) column demux 316, and output register 318.

Synchronous with the output from padder 304, counter 308 generates counter values from S=1 to S=$L^2$+2L and provides the current counter value S to row encoding logic 310 and column encoding logic 312. The current counter value S corresponds to an interleaved bit location in output register 318.

Row encoding logic 310 applies Equation (11) to the current counter value S to generate the corresponding row index n, which is applied as the control signal to row demux 314. Row demux 314 passes the current padded bit to the particular row XOR gate 320 indicated by the row index n from row encoding logic 310. Each row XOR gate 320 performs the checksum operation for the corresponding row, where each row XOR gate output is initialized to 0 for each new set of data. For the ith XOR gate 320, after all L+1 padded bits of row i have been processed, the XOR gate output represents the value of the corresponding parity bit (P_row_i).

Similarly, column encoding logic 312 applies Equation (12) to the current counter value S to generate the corresponding column index m, which is applied as the control signal to column demux 316. Column demux 316 passes the current padded bit to the particular column XOR gate 322 indicated by the column index m from column encoding logic 312. Each column XOR gate 322 performs the checksum operation for the corresponding row, where each column XOR gate output is initialized to 0 for each new set of data. For the jth XOR gate 322, after all L+1 padded bits of column j have been processed, the XOR gate output represents the value of the corresponding parity bit (P_col_j).

For the (L=3) example of FIG. 1, P_col_1 is parity bit p1, P_col_2 is parity bit p2, P_col_3 is parity bit p3, P_row_1 is parity bit p4, P_row_2 is parity bit p5, and P_row_3 is parity bit p6. As shown in FIG. 3, the outputs from the row and column XOR gates 320 and 322 are input to appropriate locations in output register 318, overwriting the zero-valued padding bits with the corresponding generated parity-bit values. For this particular implementation, the outputs from the XOR gates are "hard-wired" to the appropriate locations in output register 318, although other implementations are possible. After all ($L^2$+2L) padded bits from padder 304 have been processed, output register 318 will contain the corresponding output codeword, which is then read out from register 318 for further processing.

Note that encoder/interleaver 300 can be modified into a pipelined architecture having two output registers, where pipelined processing can be provided by alternating between the two output registers, such that one register is being populated with the current codeword, while the previously generated codeword is being read out from the other register. The combined encoding/interleaving scheme can also be implemented in different rate architectures, such as full-rate or half-rate architectures.

Receiver

In one possible implementation, encoder/interleaver 300 of FIG. 3 is part of a transmitter that transmits the encoded data generated by encoder/interleaver 300 through a transmission channel to a receiver that processes the received signal to recover (ideally) the original data 302 applied to encoder/interleaver 300. The sequence in which each ($L^2$+2L)-bit codeword is transmitted is the same as the sequence of the interleaved data dictated by Formulas (1)-(4) and represented in FIG. 1 for the case of L=3.

Figure 4:
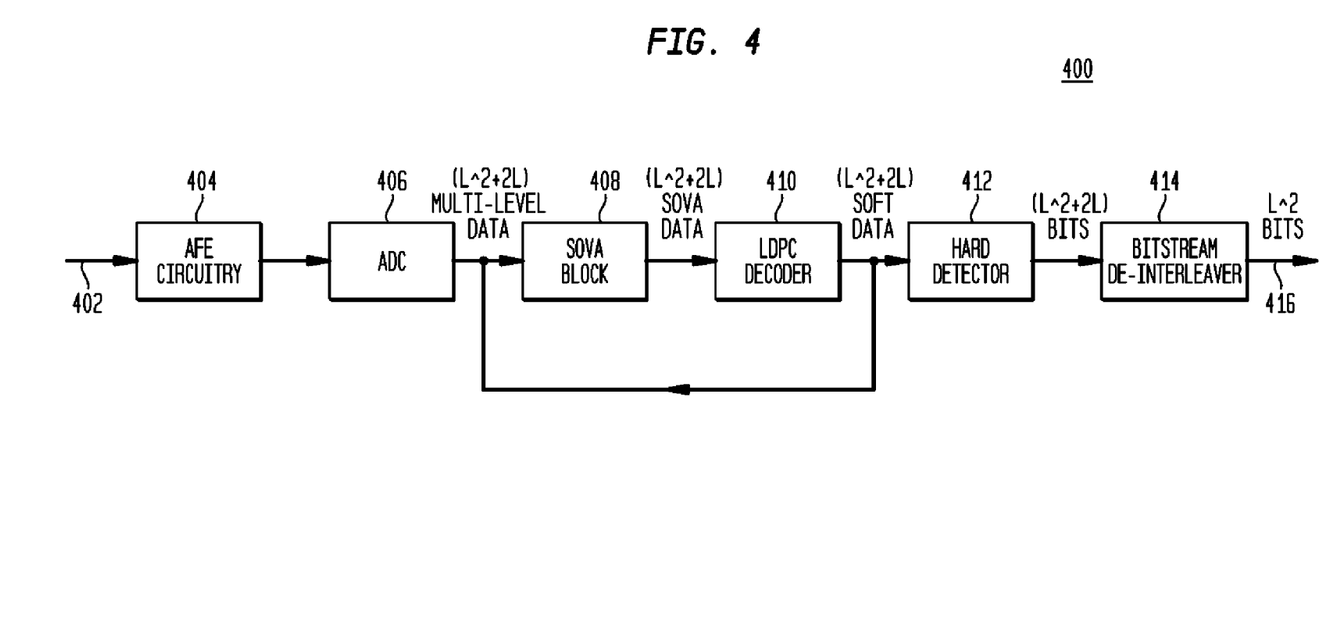
FIG. 4 shows a block diagram of (at least a portion of) a receiver, according to one embodiment of the present invention.

FIG. 4 shows a block diagram of (at least a portion of) a receiver 400, according to one embodiment of the present invention. Receiver 400 includes analog front end (AFE) circuitry 404, analog-to-digital converter (ADC) 406, soft-output Virterbi algorithm (SOVA) block 408, low-density parity-check (LDPC) decoder 410, hard detector 412, and bitstream de-interleaver 414.

Receiver 400 receives, from a transmission channel, an analog signal 402 corresponding to the encoded/interleaved data generated by encoder/interleaver 300 of FIG. 3. AFE circuitry 404 and ADC 406 process and digitize this received analog signal to generate multi-level digital data, where each multi-bit value corresponds to a different bit of encoded/interleaved data generated by encoder/interleaver 300. Thus, each set of ($L^2$+2L) multi-bit values generated by ADC 406 corresponds to a different ($L^2$+2L)-bit codeword generated by encoder/interleaver 300.

For each set of ($L^2$+2L) multi-bit values received from ADC 406, SOVA block 408 performs a conventional soft-output Viterbi algorithm to generate ($L^2$+2L) multi-bit SOVA values for input to LDPC decoder 410, which performs a low-density parity-check algorithm to generate ($L^2$+2L) soft values. Depending on the particular implementation, the soft data from LDPC decoder 410 may be fed back to SOVA block 408 for one or more passes through SOVA block 408 and LDPC decoder 410 to improve the reliability of the data.

Eventually, the soft data from LDPC decoder 410 is applied to hard detector 412, which converts the ($L^2$+2L) soft values into the corresponding ($L^2$+2L) hard (i.e., 1-bit) values, $L^2$ of which correspond to original data bits and 2L of which correspond to parity bits. In one implementation, hard detector 412 generates a hard bit value of 1 for each positive value received from LDPC decoder 410 and a hard bit value of 0 for each negative value received from LDPC decoder 410.

These ($L^2$+2L) decoded bits are applied to bitstream de-interleaver 414, which removes the 2L parity bits from the interleaved bitstream to provide $L^2$ data bits of a de-interleaved, decoded bitstream 416 for any subsequent, downstream processing (not shown). In one possible implementation, like bitstream padder 304 of FIG. 3, de-interleaver 414 uses Formulas (13) and (14) to identify the locations of the 2L parity bits in the interleaved bitstream.

LDPC Decoder

Figure 5A:
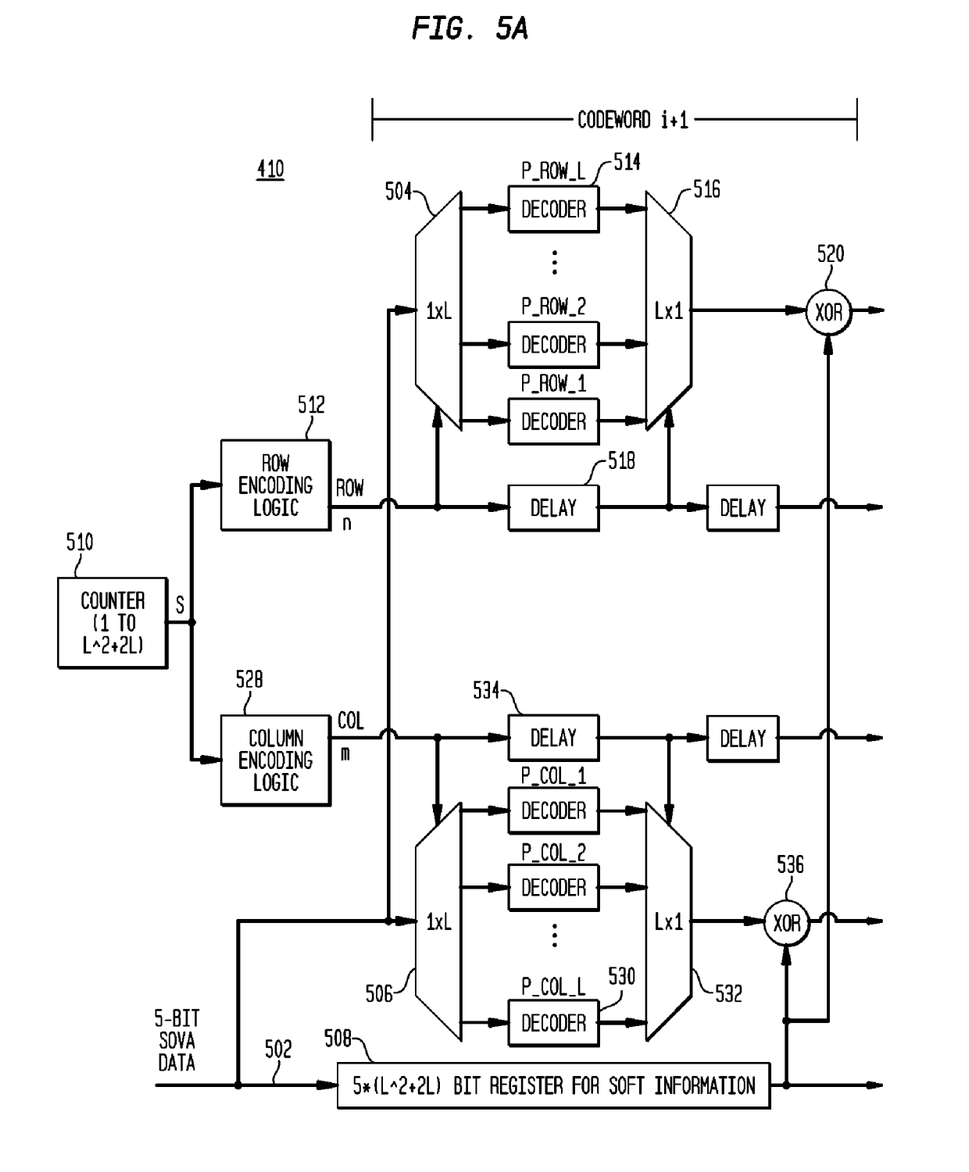
FIG. 5 shows a block diagram of the low-density parity-check (LDPC) decoder of FIG. 4, according to one embodiment of the present invention.
Figure 5B:
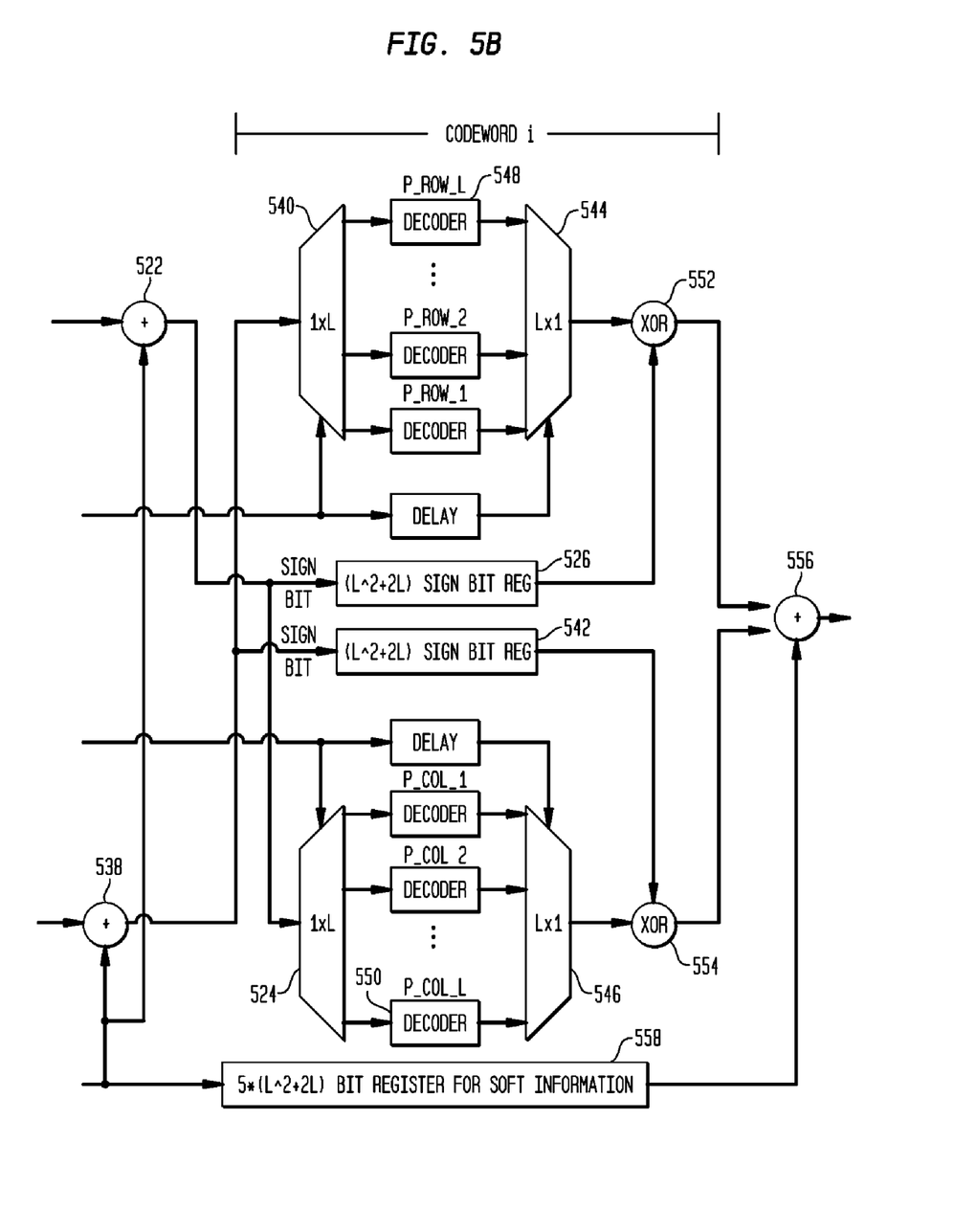

FIG. 5 shows a block diagram of LDPC decoder 410 of FIG. 4, according to one embodiment of the present invention. Decoder 410 processes the SOVA data generated by SOVA block 408 of FIG. 4 using the parity data to correct possible bit errors in the transmitted data. Decoder 410 has a two-stage, pipelined architecture, where each set of ($L^2$+2L) soft bits is processed first by the first stage labeled "Codeword i+1" and then by the second stage labeled "Codeword i." While the first stage is processing the soft bits of the (i+1)$^{st}$ codeword, the second stage is processing the soft bits of the i$^{th}$ codeword.

Each soft bit in input stream 502 is applied to (1×L) row demux 504, (1×L) column demux 506, and soft bit register 508. Counter 510 is synchronized with input stream 502 and sequentially generates counter values S from 1 to ($L^2$+2L) for each set of soft bits in input stream 502.

Counter value S is applied to row encoding logic 512, which applies Equation (11) to the current counter value S to generate the corresponding row index n, which is applied as the control signal to row demux 504. In the first stage of decoder 410, row demux 504 passes the current soft bit to the particular row decoder 514 indicated by the row index n from row encoding logic 512. Each row decoder 514 performs conventional min-sum parity decoding for the corresponding row to generate (L+1) unsigned, decoded values for that row, according to Equation (15) as follows:

$$LLR_j^{new} = \prod_{i \neq j} \text{sgn}(LLR_i^{old}) \cdot \min_{i \neq j} |LLR_i^{old}|, \quad (15)$$

where LLR is the log-likelihood ratio for the corresponding SOVA value, the function "sgn" returns the sign of the applied value, the function "min" returns the minimum of the applied values, and the column indices i and j range from 0 to L for the corresponding row.

The output of each row decoder 514 is applied to the corresponding input port of (L×1) row mux 516, which selects, based on the delayed row index n from delay 518, the value at its corresponding input to output to XOR node 520. Delay 518 delays the row index n from row encoding logic 512 based on the processing time of decoders 514. XOR node 520 applies an XOR operation to the unsigned output from mux 516 and the sign bit of the corresponding soft bit in register 508 to generate a signed, decoded value that is applied to summation node 522, which adds the signed, decoded value from XOR node 520 to the corresponding soft bit in register 508. The resulting summation value is applied to column demux 524 and the sign bit of that summation value is applied to sign-bit register 526.

Similarly, counter value S is applied to column encoding logic 528, which applies Equation (12) to the current counter value S to generate the corresponding column index m, which is applied as the control signal to column demux 506. In the first stage of decoder 410, column demux 506 passes the current soft bit to the particular column decoder 530 indicated by the column index m from column encoding logic 528. Analogous to row decoders 514, each column decoder 530 performs conventional min-sum parity decoding for the corresponding column to generate (L+1) unsigned, decoded values for that column, according to Equation (15), in this case, i and j are row indices that range from 0 to L for the corresponding column.

The output of each column decoder 530 is applied to the corresponding input port of (L×1) column mux 532, which selects, based on the delayed column index m from delay 534, the value at its corresponding input to output to XOR node 536. Like delay 518, delay 534 delays the column index m from column encoding logic 528 based on the processing time of decoders 530. XOR node 536 applies an XOR operation to the unsigned output from mux 532 and the sign bit of the corresponding soft bit in register 508 to generate a signed, decoded value that is applied to summation node 538, which adds the signed, decoded value from XOR node 536 to the corresponding soft bit in register 508. The resulting summation value is applied to row demux 540 and the sign bit of that summation value is applied to sign-bit register 542.

The architecture and processing of the second stage of decoder 410 is analogous to that of the first stage, where delayed versions of the row index n are applied to row demux 540 and row mux 544 and delayed versions of the column index m are applied to column demux 524 and column mux 546. Row decoders 548 and column decoders 550 are analogous to row decoders 514 and column decoders 530, respectively. Note that the sign bits from register 526 are applied to the outputs from row mux 544 at XOR node 552, while the sign bits from register 542 are applied to the outputs from column mux 546 at XOR node 554.

Summation node 556 sums the outputs from XOR nodes 552 and 554 with the soft bits stored in register 558 to generate signed data that can be applied to either SOVA block 408 or hard detector 412.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:

1. A decoding-apparatus-implemented method for decoding a codeword generated by encoding and interleaving a set of $L^2$ original data values having an original sequence, the method comprising:
   (a) receiving the codeword having $L^2$ original data values, L row parity values, and L column parity values; and
   (b) applying low-density parity-check decoding to the codeword to generate a decoded codeword, wherein:
      the $L^2$ original data values correspond to an (L×L) original block of data;
      the original block corresponds to the $L^2$ original data values arranged in rows and columns of non-contiguous original data values in the original block;
      each row parity value corresponds to an application of a row parity operation to a different row of non-contiguous original data values in the original block;
      each column parity value corresponds to an application of a column parity operation to a different column of non-contiguous original data values in the original block;
      the codeword comprises the $L^2$ original data values in the original sequence and interleaved with the L row parity values and the L column parity values; and
      step (b) comprises generating the decoded codeword based on the non-contiguity of the original data values in the rows and columns of the original block.

2. The method of claim 1, wherein:
   the original block corresponds to the original sequence of the $L^2$ original data values arranged in a diagonal pattern in the original block; and
   step (b) comprises applying the diagonal pattern in generating the decoded codeword.

3. The method of claim 1, wherein the codeword corresponds to an (L+1)×(L+1) augmented block of data comprising:
   the L row parity values correspond to Column 0 of the augmented block;
   the L column parity values correspond to Row 0 of the augmented block;
   the $L^2$ original data values correspond to Rows 1-L and Columns 1-L of the augmented block; and
   step (b) comprises retrieving the decoded codeword from the augmented block based on non-contiguity of the original data values in the row and columns of the augmented block.

4. The method of claim 3, wherein, according to the structured interleaving, locations S in the codeword for the $L^2+2L$ values in the augmented block correspond to:

$$n=\mathrm{mod}(S,L+1)$$

$$m=\mathrm{mod}(\mathrm{mod}(S,L+1)+\mathrm{floor}(S,L+1)),L+1),$$

where:
   S runs from 1 to $L^2+2L$;
   mod (x, y) is a modulo function that returns the integer remainder from an integer division of x by y;
   floor (x, y) is a floor function that returns the integer result of the integer division of x by y;
   n is a row index in the augmented block for the $S^{th}$ codeword location, where n∈{0, . . . , L};
   m is a column index in the augmented block for the $S^{th}$ codeword location, where m∈{0, . . . , L}; and step (b) comprises retrieving the decoded codeword from the augmented block based on the locations S.

5. The method of claim 1, further comprising the step of de-interleaving the decoded codeword by removing the parity values from the decoded codeword, wherein locations of the parity values in the decoded codeword are based on one or more closed-form mathematical expressions.

6. An apparatus for decoding a codeword generated by encoding and interleaving a set of $L^2$ original data values having an original sequence, the apparatus adapted to:
   (a) receive the codeword having $L^2$ original data values, L row parity values, and L column parity values; and
   (b) apply low-density parity-check (LDPC) decoding to the codeword to generate a decoded codeword, wherein:
       the $L^2$ original data values correspond to an (L×L) original block of data;
       the original block corresponds to the $L^2$ original data values arranged in rows and columns of non-contiguous original data values in the original block;
       each row parity value corresponds to an application of a row parity operation to a different row of non-contiguous original data values in the original block;
       each column parity value corresponds to an application of a column parity operation to a different column of non-contiguous original data values in the original block;
       the codeword comprises the $L^2$ original data values in the original sequence and interleaved with the L row parity values and the L column parity values; and
       the apparatus is adapted to generate the decoded codeword based on the non-contiguity of the original data values in the rows and columns of the original block.

7. The apparatus of claim 6, wherein the apparatus comprises an LDPC decoder comprising:
   row encoding logic adapted to map a current location in the codeword to a row index of a corresponding (L+1)×(L+1) augmented block of data;
   column encoding logic adapted to map the current codeword location to a column index of the augmented block;
   a first LDPC decoding stage adapted to partially decode L rows and L columns of the augmented block to generate a partially decoded augmented block; and
   a second LDPC decoding stage adapted to further decode L rows and L columns of the partially decoded augmented block to generate a fully decoded augmented block, wherein:
       the first LDPC decoding stage comprises L row decoders and L column decoders;
       the second LDPC decoding stage comprises L row decoders and L column decoders;
       the row index generated by the row encoding logic is used to direct (1) a current value of the augmented block to a corresponding row decoder in the first stage and (2) a current value of the partially decoded augmented block to a corresponding row in the second stage; and
       the column index generated by the column encoding logic is used to direct (1) a current value of the augmented block to a corresponding column decoder in the first stage and (2) a current value of the partially decoded augmented block to a corresponding column in the second stage.

8. The apparatus of claim 7, wherein:
the row encoding logic evaluates a first closed-form mathematical expression to calculate the row index n for the current codeword location S; and
the column encoding logic evaluates a second closed-form mathematical expression to calculate the column index m for the current codeword location S.

9. The apparatus of claim 8, wherein:
the first closed-form mathematical expression corresponds to:

$$n=\mod(S,L+1)$$

the second closed-form mathematical expression corresponds to:

$$m=\mod(\mod(S,L+1)+\mathrm{floor}(S,L+1)),L+1).$$

10. The apparatus of claim 6, further comprising a de-interleaver adapted to de-interleave the decoded codeword by removing the parity values from the decoded codeword, wherein locations of the parity values in the decoded codeword are based on one or more closed-form mathematical expressions.

11. The apparatus of claim 6, wherein:
the original block corresponds to the original sequence of the $L^2$ original data values arranged in a diagonal pattern in the original block; and
the apparatus is adapted to apply the diagonal pattern in generating the decoded codeword.

12. An apparatus for decoding a codeword generated by encoding and interleaving a set of $L^2$ original data values having an original sequence, the apparatus adapted to:
   (a) receive the codeword having $L^2$ original data values, L row parity values, and L column parity values; and
   (b) apply low-density parity-check (LDPC) decoding to the codeword to generate a decoded codeword, wherein:
       the $L^2$ original data values correspond to an (L×L) original block of data;
       each row parity value corresponds to an application of a row parity operation to a different row of the original block;
       each column parity value corresponds to an application of a column parity operation to a different column of the original block;
       the codeword comprises the $L^2$ original data values in the original sequence and interleaved with the L row parity values and the L column parity values; and
       the apparatus comprises an LDPC decoder comprising:
           row encoding logic adapted to map a current location in the codeword to a row index of a corresponding (L+1)×(L+1) augmented block of data;
           column encoding logic adapted to map the current codeword location to a column index of the augmented block;
           a first LDPC decoding stage adapted to partially decode L rows and L columns of the augmented block to generate a partially decoded augmented block; and
           a second LDPC decoding stage adapted to further decode L rows and L columns of the partially decoded augmented block to generate a fully decoded augmented block, wherein:
               the first LDPC decoding stage comprises L row decoders and L column decoders;
               the second LDPC decoding stage comprises L row decoders and L column decoders;
               the row index generated by the row encoding logic is used to direct (1) a current value of the augmented block to a corresponding row decoder in the first stage and (2) a current value of the partially decoded augmented block to a corresponding row in the second stage; and the column index generated by the column encoding logic is used to direct (1) a current value of the augmented block to a corresponding column decoder in the first stage and (2) a current value of the partially decoded augmented block to a corresponding column in the second stage.

13. The apparatus of claim 12, wherein:
the row encoding logic evaluates a first closed-form mathematical expression to calculate the row index n for the current codeword location S; and
the column encoding logic evaluates a second closed-form mathematical expression to calculate the column index m for the current codeword location S.

14. The apparatus of claim 13, wherein:
the first closed-form mathematical expression corresponds to:

$$n = \mathrm{mod}(S, L+1)$$

the second closed-form mathematical expression corresponds to:

$$m = \mathrm{mod}(\mathrm{mod}(S, L+1) + \mathrm{floor}(S, L+1), L+1).$$

* * * * *